United States Patent
Kazama et al.

(10) Patent No.: US 7,239,158 B2
(45) Date of Patent: *Jul. 3, 2007

(54) HOLDER FOR CONDUCTIVE CONTACT

(75) Inventors: Toshio Kazama, Nagano (JP);
Mitsuhiro Nagaya, Nagano (JP);
Hiroyasu Sotoma, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/510,778

(22) PCT Filed: Apr. 16, 2003

(86) PCT No.: PCT/JP03/04837

§ 371 (c)(1),
(2), (4) Date: Apr. 29, 2005

(87) PCT Pub. No.: WO03/087852

PCT Pub. Date: Oct. 23, 2003

(65) Prior Publication Data

US 2005/0225313 A1    Oct. 13, 2005

(30) Foreign Application Priority Data

Apr. 16, 2002  (JP)  .............................. 2002-113485
Apr. 26, 2002  (JP)  .............................. 2002-126875

(51) Int. Cl.
*G01R 31/02*  (2006.01)
(52) U.S. Cl. ..................................... 324/754
(58) Field of Classification Search ........ 324/754–758, 324/73.1, 103 P, 761–765, 158.1
See application file for complete search history.

(56) References Cited

U.S. PATENT DOCUMENTS 5,819,410 A * 10/1998 Furusawa et al. .............. 29/883

(Continued)

FOREIGN PATENT DOCUMENTS

JP          60-168062          8/1985

(Continued)

OTHER PUBLICATIONS

English Language Abstract, Japanese Publication No. 60-168062, Published Aug. 31, 1985, 1 p.

(Continued)

*Primary Examiner*—Ha Tran Nguyen
*Assistant Examiner*—Roberto Velez
(74) *Attorney, Agent, or Firm*—MacPherson Kwok Chen & Heid LLP; David S. Park (57) ABSTRACT

A holder supported by an arm comprises a metallic reinforcing member and a plastic holder hole forming member filled in an opening formed in the reinforcing member. Holder holes are formed in the holder hole forming member, and a coil spring and electroconductive needle members are installed in each holder hole to thereby provide a contact probe having two moveable ends. Because the holder is essentially made of the metallic member, the mechanical strength of the holder can be improved over that formed strictly from plastic material. Therefore, the contact probe holder would not suffer from dimensional changes of the holder owing to aging compounded by temperature changes for testing (tests under high temperature conditions) and residual stress so that the change in the pitch of the holder holes can be avoided, and a high level of precision can be ensured. Therefore, the contact probe allows tests to be conducted in a stable manner over an extended period of time.

16 Claims, 7 Drawing Sheets

U.S. PATENT DOCUMENTS

| | | | |
|---|---|---|---|
| 6,255,832 B1 * | 7/2001 | Notohardjono et al. | 324/754 |
| 6,337,572 B1 * | 1/2002 | Kazama | 324/754 |
| 6,894,515 B2 * | 5/2005 | Okano et al. | 324/754 |
| 7,157,922 B2 * | 1/2007 | Kazama | 324/754 |
| 2005/0258843 A1 * | 11/2005 | Kazama | 324/754 |

FOREIGN PATENT DOCUMENTS

| | | |
|---|---|---|
| JP | 60-154868 | 10/1985 |
| JP | 7-225245 | 8/1995 |
| JP | 8-201427 | 8/1996 |
| JP | 8-271547 | 10/1996 |
| JP | 11-108954 | 4/1999 |
| JP | 11-281673 | 10/1999 |
| JP | 2001-223247 | 8/2001 |
| WO | WO 00/03250 | 1/2000 |

OTHER PUBLICATIONS

English Lanugage Summary, Japanese Publication No. 60-154868, Published Oct. 15, 1985, 1 p.

English Language Abstract, Japanese Publication No. 7-225245, Published Aug. 22, 1995, 1 p.

English Language Abstract, Japanese Publication No. 8-201427, Published Aug. 9, 1996, 1 p.

English Language Abstract, Japanese Publication No. 8-271547, Published Oct. 18, 1996, 1 p.

English Language Abstract, Japanese Publication No. 11-108954, Published Apr. 23, 1999, 1 p.

English Language Abstract, Japanese Publication No. 11-281673, Published Oct. 15, 1999, 1 p.

English Language Abstract, Japanese Publication No. 2001-223247, Published Aug. 17, 2001, 1 p.

Microfilm of the specification and drawings annexed to the request of Japanese Utility Model Application No. 36820/1989 (Laid-open No. 128961/1990) (Tsuneo Kasahara), Oct. 24, 1990, Fig. 1.

Microfilm of the specification and drawings annexed to the request of Japanese Utility Model Application No. 93110/1990 (Laid-open No. 51663/1992) (Organ Needle Co., Ltd.), Apr. 30, 1992, Fig. 8.

\* cited by examiner

PRIOR ART

HOLDER FOR CONDUCTIVE CONTACT

TECHNICAL FIELD

The present invention relates to an electroconductive contact probe holder that can be used for passing electric signals to and from printed circuit boards, electronic devices or the like.

BACKGROUND OF THE INVENTION

Contact units that are used in contact probes for electrically testing conductive patterns of printed circuit boards and electronic devices include those having a pair of needle members that are disposed so as to be moveable in the axial direction on either axial end as disclosed in Japanese UM laid open publication No. 60-154868. Such an electroconductive contact unit having two moveable ends is typically used for temporarily connecting, for testing purposes, two circuit boards that are eventually permanently connected in the final product. LCD panels and array circuit boards can be tested by using a contact probe having a same number of contact units as the number of electrodes in the circuit pattern of the LCD panel. The testing of the LCD panel typically takes place before the LCD panel is finally connected to a TAB consisting of a panel drive LSI and a printed circuit board.

As disclosed in Japanese patent application No. 06-87337 by the same applicant, an electroconductive contact probe holder can be formed by laminating a plurality of insulating plastic plates one over another. In each contact unit of such a contact probe, electroconductive needle members are provided on either end of a compression coil spring, and a holder hole for receiving this assembly is formed by a hole passed across the thickness of these insulating plates.

Figure 9:
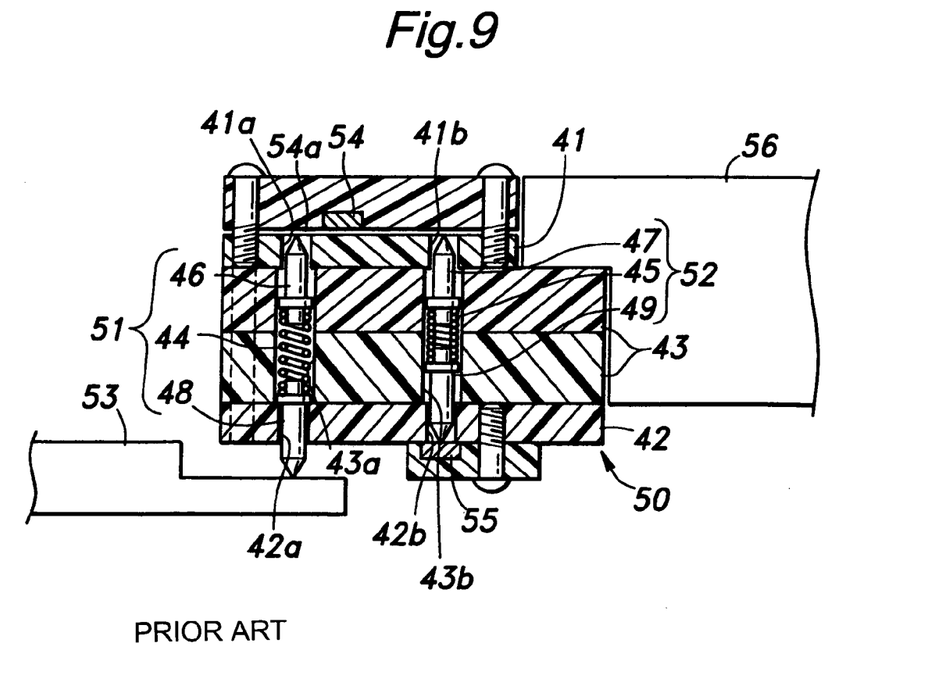
FIG. 9 is a schematic longitudinal sectional view of the conventional contact probe holder.

A specific example is illustrated in FIG. 9, small diameter holes 41a, 41b, 42a and 42b are formed in upper and lower insulating members 41 and 42, and large diameter holes 43a and 43b are formed in intermediate insulating members 43 laminated between the upper and lower insulating members 41 and 42 so that coil springs 44 and 45 are received in the corresponding large diameter holes 43a and 43b and the needle portions of the needle members 46, 47, 48 and 49 are supported by the corresponding small diameter holes 41a, 41b, 42a and 42b. Each needle member 46-49 is provided with a flange portion adapted to be received in the corresponding large diameter hole 43a or 43b and engage a shoulder defined between the corresponding large diameter hole 43a or 43b and small diameter hole 41a, 41b, 42a or 42b to prevent the corresponding needle member 46-49 from coming off.

These insulating members 41 to 43 jointly form a laminated assembly 50, and a plurality of contact units 51 each comprising a coil spring 44 and a pair of needle members 46 and 48 are arranged in this holder, the number of the contact units 51 corresponding to the number of the terminals of an LCD panel 53. The insulating members 41 to 43 may be joined to each other by using threaded bolts or a bonding agent. In the illustrated example, each contact unit 51 is electrically connected to another contact unit 52 consisting of a coil spring 45 and needle members 47 and 49 via a sheet portion 54a of a TAB 54 provided on the upper surface of the upper insulating member 41, and the needle member 49 of the contact unit 52 is in turn connected to an external testing device via a PCB 55 provided on the lower surface of the lower insulating member 42.

The holder 50 for the contact units each having two moveable ends is constructed as described above, and includes holder holes consisting of large diameter holes 43a and 43b and small diameter holes 41a, 41b, 42a and 42b. An arm 56 of an actuator supports the holder 50 via a part of the intermediate insulating member 43, for instance. In the course of a test, the arm 56 is moved and the needle members 48 are resiliently engaged with the terminals of the LCD panel 53.

However, according to this arrangement, because each of the insulating members that form the holder consists of a single piece member made of plastic material, dimensional errors may be produced in the holder over time owing to the change in temperature during the test (test under a high temperature condition), residual stress produced by a machining or other working process and absorption of moisture. Such dimensional errors give rise to changes in the pitch between adjacent holder holes and the positional precision of the contact point of each contact unit (the position of the tip of the needle member) may be impaired.

BRIEF SUMMARY OF THE INVENTION

In view of such problems of the prior art, a primary object of the present invention is to provide a contact probe holder that can ensure a high level of positional precision to the contact points while simplifying the manufacturing process.

A second object of the present invention is to provide a contact probe holder that can be reduced in thickness without compromising the mechanical strength thereof.

A third object of the present invention is to provide a contact probe holder that is favorable in terms of both electric and mechanical properties.

According to the present invention, at least most of the objects can be accomplished by providing an electroconductive contact probe holder for supporting a plurality of contact units for contacting an object, comprising: a base plate made of a first material and provided with an opening therein; and film made of a second material and deposited on a surface of the base plate so as to cover at least an inner circumferential surface of the opening; a holder hole forming member made of a third material and filled in the opening substantially without extending outside the opening; a plurality of holder holes being passed across a thickness of the holder hole forming member each for receiving a contact unit therein.

The first material may comprise a member selected from a group consisting of metallic material, semiconductor material, ceramic material and glass material, and the second and third materials may comprise a same or different plastic materials.

According to this arrangement, the support members of the holder may be made from high strength material such as metallic material having a low coefficient of thermal expansion, and the dimensional changes owing to the change in temperature during testing (tests under a high temperature condition) can be favorably controlled because the holder is in effect substantially entirely made of the high strength material as opposed to a holder entirely made from plastic material. Dimensional changes due to aging compounded by residual stress can be avoided. Therefore, even when the terminals of the chip or the like that are to be accessed are densely arranged, an adequate level of positional precision can be maintained in the pitch of the corresponding contact units without regard to the surrounding environment and the service period.

In particular, if film is formed on the inner circumferential surface of the opening to enhance a bonding force between the base plate and holder hole forming member, the force of attachment of the holder hole forming member in the opening can be increased, and the integrity of the contact probe can be improved. Even if the bonding force between the film and base plate is not strong, by depositing the film substantially over the entire surface of the base plate, the film can be firmly attached to the base plate, and the bonding force between the holder hole forming member and base plate can be easily increased.

The film may be formed on the outer surface of the high strength base plate and the inner circumferential surface of the opening, and material suitable for forming the holder holes may be laminated over the film. Thereby, the masking that would be necessary when material suitable for forming holder holes is simply filled into the opening is not required, and the work efficiency can be improved. If film consisting of insulating plastic material is coated over the surface of the base plate, and the material suitable for forming holder holes that is placed over the film is electrically insulating, the overall insulating property can be improved owing to the provision of the two layers of insulating material. Therefore, the thickness of the film and layer can be reduced without impairing the insulating performance, and the reduced thickness of the film and layer allows the thickness of the holder to be minimized.

The material of the holder hole forming member may consist of plastic material which produces relatively little static electricity, and at least a surface of the high strength base plate that requires insulation may be provided with insulating film. Thereby, when the electrostatic property is required to be considered owing to the highly dense population of the terminals of the chip or other object to be tested, the holder hole forming member may be made from plastic material having a favorable electrostatic property as the insulating film makes up for the deficiency the material of the holder hole forming member may have in electric insulation.

The high strength base plate may be provided with a threaded hole for joining the holder with another member so that the mechanical strength of the thread is increased as compared with that formed in a plastic member, and the fastening force of the threaded bolts can be increased. Therefore, the holder can be firmly joined to the other member. Also, even if the holder is assembled and disassembled repeatedly, the thread would not be damaged, and the maintenance of the contact probe is facilitated.

According to a preferred embodiment of the present invention, an engagement feature is formed on an inner circumferential surface of the opening so that the force of attachment between the holder hole forming member and base plate can be increased. According to a particularly preferred embodiment of the present invention, the base plate is made of a silicon wafer and an engagement feature comprises an inwardly directed ridge formed by anisotropically etching the inner circumferential surface of the opening.

BRIEF DESCRIPTION OF THE DRAWINGS

Now the present invention is described in the following with reference to the appended drawings, in which:

FIG. 7b is a sectional view taken along line VIIb-VIIb of FIG. 7a;

DETAILED DESCRIPTION OF THE PREFERRED EMBODIMENTS

Figure 1:
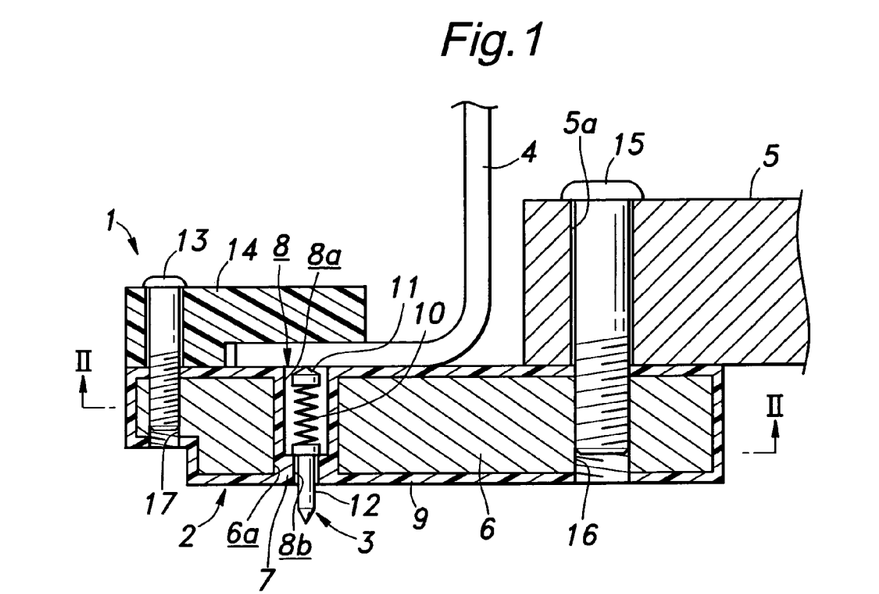
FIG. 1 is a schematic longitudinal sectional view of a holder for a contact probe embodying the present invention.
Figure 2:
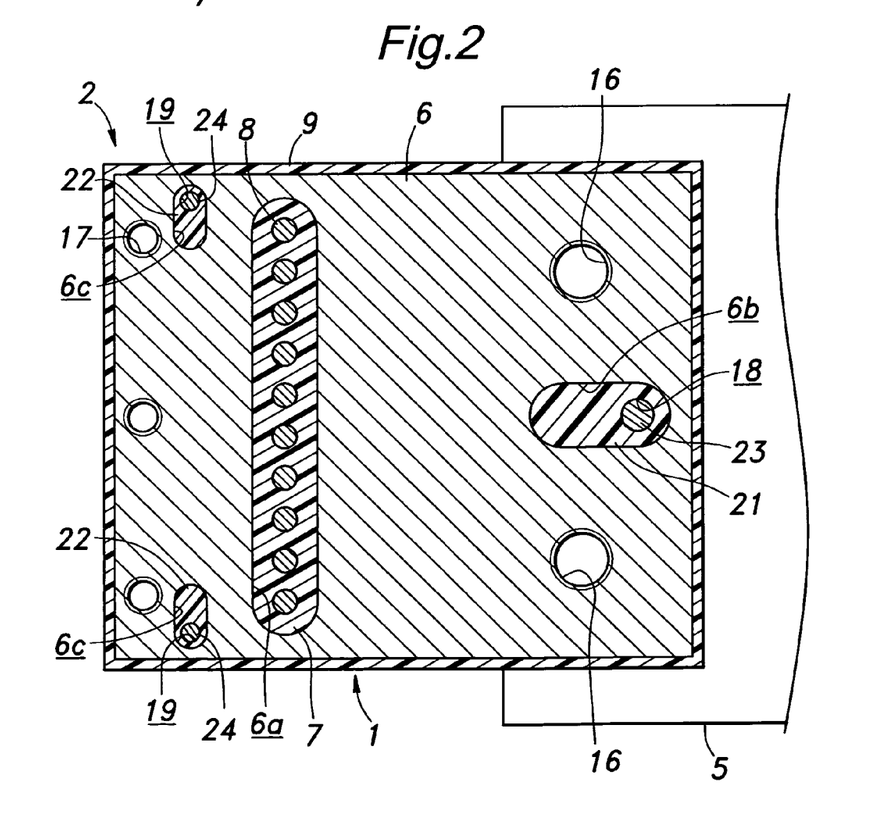
FIG. 2 is a sectional view taken along line II-II of FIG. 1.

FIG. 1 is a schematic longitudinal sectional view of a contact probe using a contact probe holder embodying the present invention, and FIG. 2 is a sectional view taken along line II-II of FIG. 1. As shown in the drawings, the illustrated contact probe 1 comprises a holder 2 in the form of a plate member, a plurality of contact units 3 which are arranged in two locations of the holder 2, and a circuit board 4 for electrically connecting the contact units 3 with a testing device not shown in the drawings. The illustrated contact probe may be used for testing LCD panels before completion as was the case with the conventional contact probe, and is adapted to be vertically moveable in the drawings by using an arm 5 of an actuator to access the terminals (not shown in the drawings) of an LCD panel placed in a lower part as seen in the drawing for applying the contact probe 3 thereto for a testing purpose.

The holder 2 comprises a high strength base plate 6 made of a heat resistant and low thermal expansion coefficient metal alloy such as invar and covar, and a holder hole forming member 7 made of plastic material is filled or otherwise placed in an elongated opening 6a provided in a part of the high strength base plate 6. The high strength material for the base plate 6 may also be selected from semiconductor material, ceramic material and glass material depending on the particular need. The plastic material may be selected from those which are electrically highly insulating. In the illustrated high strength base plate 6, a layer 9 made of a same plastic material as the holder hole forming member 7 is placed over the overall surface of the high strength base plate 6 as well as over the inner circumferential surface of the opening 6a. This can be accomplished by first forming the plastic layer 9 in the form of film over the entire surface of the base plate 6 and then filling the holder hole forming member 7 made of the same material in the opening 6a. The coating process that can be used for this purpose may be selected from calendar process, extrusion, dipping, spraying, spreading and electro-deposition. Conversely, one may first fill the holder hole forming member 7 in the opening 6a, and then form the plastic layer 9 over the remaining surface of the base plate 6 in the form of film. In either case, the holder hole forming member 7 and plastic layer 9 integrally merge with each other. Further, the plastic layer 9 may also be formed at the same time as filling the opening 6a with the holder hole forming member 7.

The contact units 3 in this contact probe 1 may be provided with any one of a number of possible structures. In the illustrated embodiment, the holder hole forming member 7 placed in the opening 6a is formed with large diameter holes 8a and small diameter holes 8b for the holder holes 8 in a coaxial manner axially through the thickness of the holder hole forming member 7. A compression coil spring 10 is coaxially received in each of the large diameter holes 8a, and electroconductive needle members 11 and 12 are integrally attached to either axial end of the coil spring 10 by soldering, for instance.

Referring to FIG. 1, the upper needle member 11 is provided with a cylindrical drum portion 8a which is axially slidably received in the large diameter hole 8a, and a pointed end which is directed upward. The lower needle member 12 is provided a needle portion which is axially slidably received by the small diameter hole 8b and a pointed end which is directed downward. The lower needle member 12 is also provided with a flange portion which is received by the large diameter hole 8a. The coil spring 10 is interposed between the flange portion and the upper needle member 11, and the lower needle member 12 is prevented from coming off by the flange portion being engaged by a shoulder portion defined between the large diameter hole 8a and small diameter hole 8b.

Referring to FIG. 1, the upper surface of the holder 2 is attached to an end of the circuit board 4 which may consist of a flexible printed circuit board (FPC). The lower surface of the corresponding end of the FPC 4 is provided with terminal portions corresponding to the needle members 11. To the free end of the holder 2 remote from the end supported by the arm 5 is fixedly attached another member consisting of a fixed bracket 14. The corresponding end of the FPC 4 is fixedly interposed between the fixed bracket 14 and the corresponding part of the upper surface of the holder 2.

The upper open end of each large diameter hole 8a is covered by the printed circuit board 4, and the pointed ends of the needle members 11 engage the corresponding terminal portions of the printed circuit board 4 opposing the large diameter holes 8a. By suitably adjusting the length of each large diameter hole 8a so that the corresponding coil spring 10 is compressed, the needle member 11 may be applied to the corresponding terminal portion of the circuit board 4 with a suitable amount of resilient pressure. This ensures a favorable contact between the needle member and terminal portion of the circuit board 4.

Because the holder holes 8 can be formed in the holder hole forming member 7 after the holder hole forming member 7 is placed in position, the holder holes 8 can be formed in a desired configuration depending on the particular model, and an improved versatility can be achieved as opposed to the case where a high strength base plate having a fixed configuration is used.

The holder is connected to the other member or the arm 5 by threaded bolts 15. In the illustrated embodiment, the arm 5 is provided with bolt passing holes 5a and the corresponding part of the high strength base plate 6 is provided with threaded holes (female threads) 16 for threading the threaded bolts 15 thereinto so that the arm 5 and holder 2 may be joined to each other. In this case, because the high strength base plate 6 is made of metallic material and the threaded holes 16 are formed in the metallic material, the fastening force achieved by the threaded bolts 15 can be increased, and the holder 2 can be supported on the arm 5 in a highly stable manner. Also, the threads would not be damaged even after repeated assembling and disassembling of the two parts, and this is beneficial for facilitating the maintenance and improving the durability.

The threaded holes 17 for the threaded bolts 13 for securing the fixed bracket 14 to the holder 2 can also be formed in the high strength base plate 6, and this allows the fixed bracket 14 to be firmly secured to the holder 2 so that the circuit board 4 can be securely fixed simply by interposing it between the holder 2 and fixed bracket 14. By forming the fixed bracket 14 with plastic material, the circuit board can be resiliently retained by making use of the resiliency of the plastic material so that the circuit board 4 can be firmly secured without the risk of damaging it.

As shown in FIG. 2, the high strength base plate 6 is provided with holes 18 and 19 at suitable parts thereof for receiving locating pins for locating the arm 5 and fixed holder 14. These locating pin holes 18 and 19 are formed in pin hole forming portions 21 and 22 that are placed in openings 6b and 6c provided in the high strength base plate 6. The locating pin holes 18 and 19 receive locating pins 23 and 24 that extend between the arm 5 and fixed holder 14. By forming the openings 6b and 6c as elongated slots as illustrated in the drawing, the positions of the locating pin holes 18 and 19 can be adjusted along the lengths of the openings 6b and 6c so that the arrangement can be readily adapted to changes in design.

In the electroconductive contact probe holder 2 described above, the metallic material that is used as the main material for the high strength base plate 6 may be conveniently selected from those materials having a small coefficient of thermal expansion as compared with the plastic material that is used for the holder hole forming member 7. When the plastic layer 9 in the illustrated embodiment is sufficiently thin as compared with the thickness of the high strength base plate 6, the holder 2 may be considered as virtually entirely made of metallic material. Therefore, as opposed to the case where the holder is made of a one-piece plastic member, the deformation of the holder that could be induced owing to the change in temperature during use can be easily controlled. Also, the premature aging owing to the residual stress produced as a result of machining of the holder can be avoided. Because the holder 2 can be given with a high level of rigidity, various reinforcing measures (such as insert molding reinforcing plates) that would become necessary when the holder is substantially entirely made of plastic material are not required. When electric insulation is required, an insulating plastic layer 9 may be provided. In this manner, the structure is simplified, and the cost and time for manufacturing can be both reduced.

When the holder hole forming member 7 and plastic layer 9 are both integrally formed with the high strength base plate 6, they can be continually merged with each other so that the force for retaining the holder hole forming member 7 in the opening 6a can be ensured. If the thickness of the plastic layer 9 is small, such a retaining force may not be available. In such a case, a desired result can be achieved by using different materials for the holder hole forming member 7 and plastic layer 9. Such an example is described in the following with reference to FIG. 3.

Figure 3A:
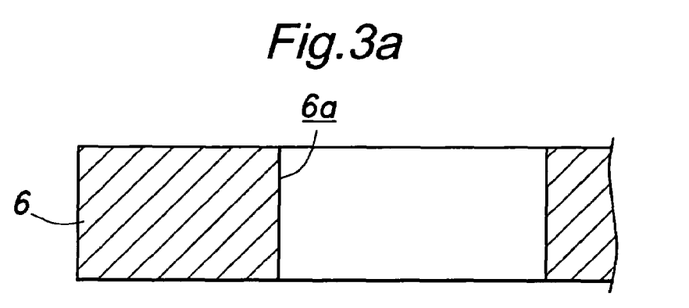
FIG. 3a is a fragmentary longitudinal sectional view of a second embodiment of the present invention comprising a high strength base plate formed with an opening.

Referring to FIG. 3a, an opening 6a is formed in a high strength support member 6 by etching, laser, blanking or other mechanical process so as to correspond to the individual chips in the wafer that is to be tested. The high strength material for the support member 6 may consist of metallic material having a low coefficient of thermal expansion such as invar and covar.

Figure 3B:
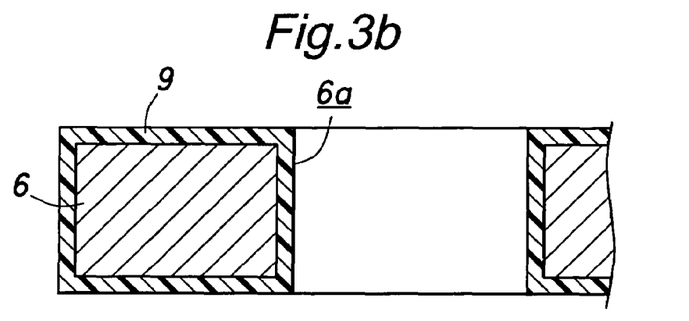
FIG. 3b is a view similar to FIG. 3a showing the holder having a plastic layer formed over the high strength base plate.
Figure 3C:
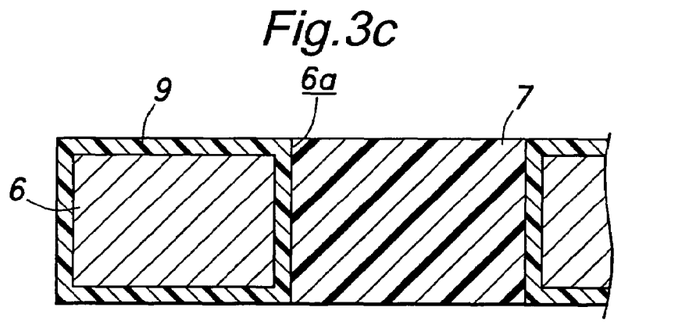
FIG. 3c is a view similar to FIG. 3a showing the holder having a holder hole forming member placed in the opening.
Figure 3D:
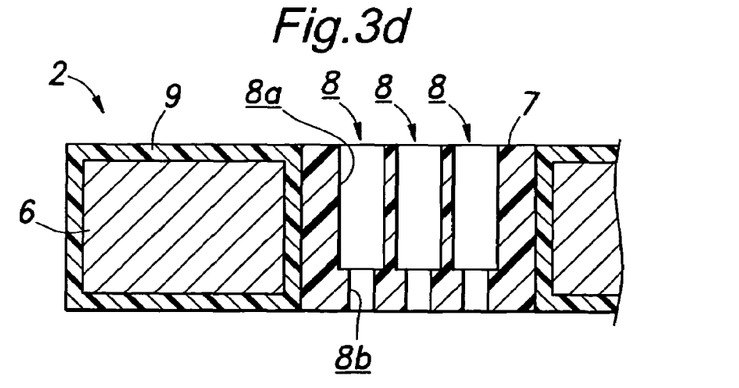
FIG. 3d is a view similar to FIG. 3a showing the holder having holder holes formed in the holder hole forming member.

Referring to FIG. 3b, relatively thin plastic layer 9 (tens or hundreds of µm thick) made of such material as insulating plastic material is coated on the surface of the high strength support member 6 having the openings 6a. The possible methods of coating may include calendar process, extrusion, immersion, spraying, spreading and electrostatic deposition. Referring to FIG. 3c, a holder hole forming member 7 made of plastic material or the like that is suitable for machining or otherwise forming the holder holes for the contact probe is filled into each of the openings 6a. The plastic layer 9 demonstrates a high bonding strength with respect to the plastic material of the holder hole forming member 7. By providing such a plastic layer 9 on the inner circumferential surface of each opening 6a, the high strength support member 6 and the plastic holder hole forming member 7 filled in the openings 6a can be firmly joined to each other. Referring to FIG. 3d, a plurality of holder holes 8 (8a and 8b) corresponding in number to the contact units for each individual chip are formed in the holder hole forming member 7.

Thus, even though the plastic layer 9 is extremely thin, an adequate adhesion (bonding or retaining force) can be ensured between the opening 6a and holder hole forming member 7 so that a lack of an adequate bonding force between the high strength base plate 6 and holder hole forming member 7 would not create a problem. Therefore, the metallic part of the high strength base plate 6 prevents a change in the overall dimensions of the holder 2 while the holder hole forming member 7 for supporting the contact units 3 may consist of material that is suitable for machining and provided with a required lubricating property. According to the prior art, material which would not cause undesired dimensional changes even when exposed to significant changes in temperature is often unsuitable for machining and lacking in a required lubricating property. However, the present invention eliminates such a compromise in the selection of the material.

When a thin plastic layer 9 is coated over the surface of the holder, the thickness of the plastic layer can be made thinner than would be possible if such a layer is formed by insert molding. In particular, even when the thickness of the holder is as small as 1 mm, a large part of the thickness of the holder is accounted for by the high strength base plate so that a high mechanical strength can be ensured even when the holder is thin. Therefore, this arrangement is highly suited for use in holders using thin base plate, and allow a thinner and large holder than would be possible with the conventional arrangement to be achieved.

The contact probe described above was designed for testing LCD panels, but can also be used in other applications. For instance, the object to be tested may consist of chips including highly densely populated terminals. In such a case, because the terminals are highly densely arranged and the adjacent needle members (coil springs) of the contact units are located closely to one other, the thickness of the wall separating the adjacent support holes 8 in the holder hole forming member 7 becomes extremely thin. Therefore, the material for the holder hole forming member 7 is required to have a favorable electrostatic property. However, readily available plastic material having a favorable electrostatic property tends to be poor in electric insulation.

However, a desired electric insulation can be ensured to the holder 2 by using highly electrically insulating material for the plastic layer. In such a case, material having a favorable electrostatic property can be used for the holder hole forming member 7. Such an arrangement allows an electrostatic property that meets the need of highly integrated devices to be achieved. Thus, material that suits the particular need can be used for the holder hole forming member 7, and the application of the contact probe can be expanded.

This is also applicable to contact probes for wafer level tests, and the holder for such an application is provided with a size comparable to that of the wafer (200 to 300 mm in diameter). When the thickness of such a holder is reduced to reduce the overall length of each contact unit, the holder is required to have a correspondingly high mechanical strength. The mechanical strength become greater as the proportion of the metallic or other high strength base plate in the total thickness increases, and the holder described above is suitable for such an application.

An insulating plastic layer 9 was formed over the surface of the high strength base plate 6 in the above described embodiment, but may also be omitted if the high strength base plate 6 is electrically insulated with respect to another component connected to the holder. If the connecting portion is not required to be insulated, the insulating plastic layer 9 may not be formed over the surface of the high strength base plate 6. In such a case, the holder hole forming member 7 may be directly filled into the opening 6a.

Figure 4A:
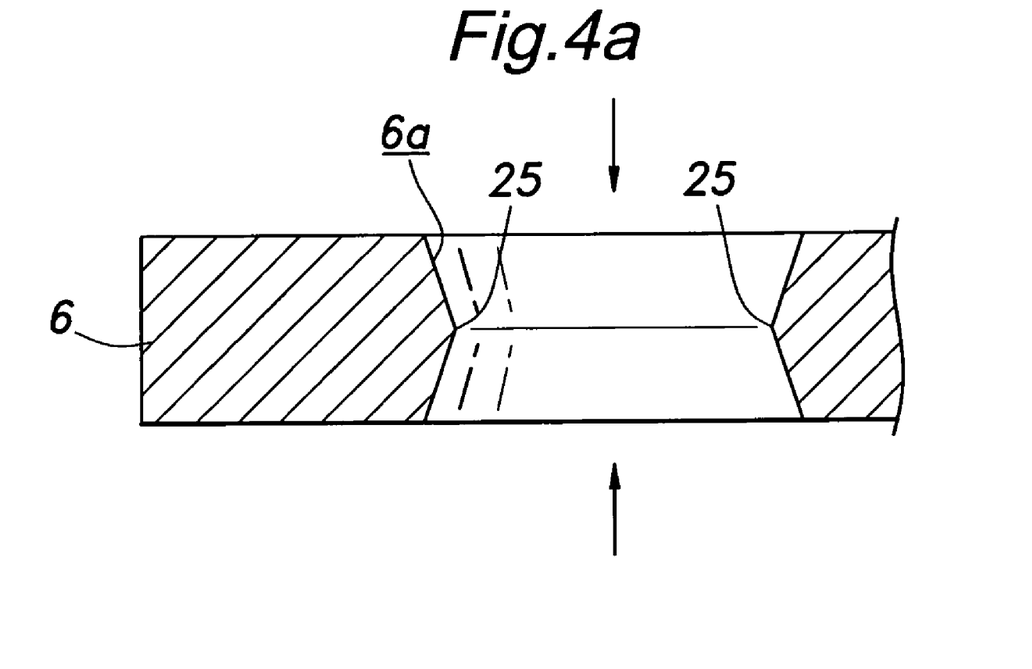
FIG. 4a is a view similar to FIG. 3a showing a holder given as a third embodiment comprising an opening provided with a ridge.

As shown in FIG. 4a, the openings 6a can be formed in the high strength base plate 6 by etching, and by conducting etching from both directions as indicated by the arrows in FIG. 4a, a ridge 25 that projects radially inward in an axially middle part of the openings and can serve as a means for preventing the dislodging of the holder hole forming portions 7 can be easily formed. This can be readily accomplished by using a base plate made from a silicon wafer, and anisotropically etching said inner circumferential surface of said opening, and no special work is required.

Figure 4B:
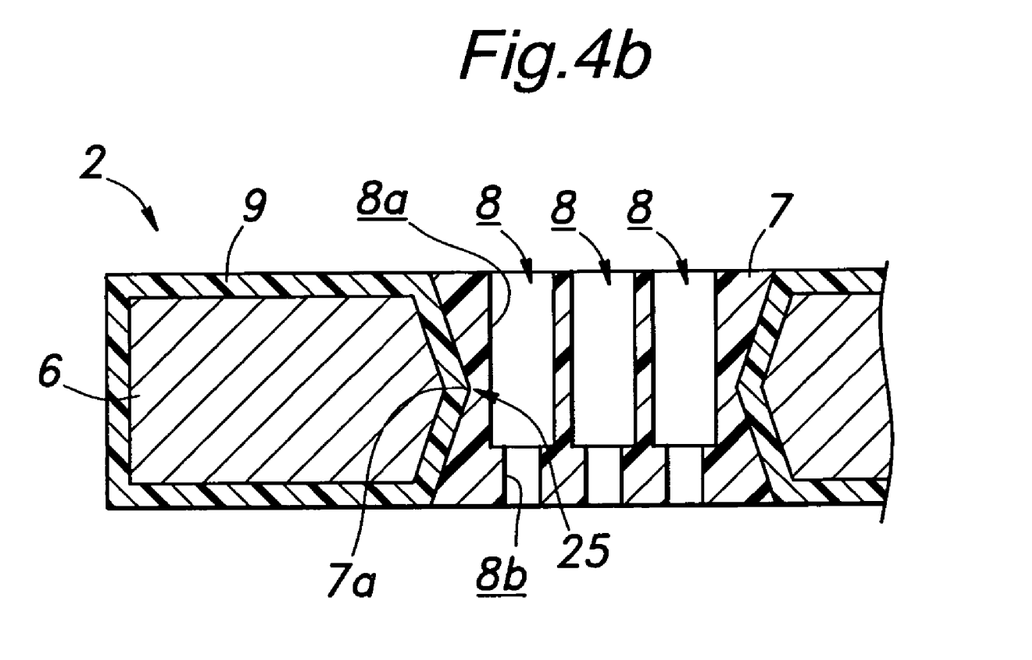
FIG. 4b is a view similar to FIG. 4a showing the holder having a holder hole forming member placed in the opening.

By filling the holder hole forming portion 7 in the opening 6a, a recess 7a corresponding to the ridge 25 is formed in the holder hole forming portion 7 as shown in FIG. 4b. Therefore, even when the holder hole forming portion 7 has shrunk over time, the engagement between the ridge 25 and recess 7a prevents the dislodging movement of the holder hole forming portion 7 (the axial direction of the opening 6a), and the holder hole forming portion 7 can be retained in a reliable fashion.

Figure 5:
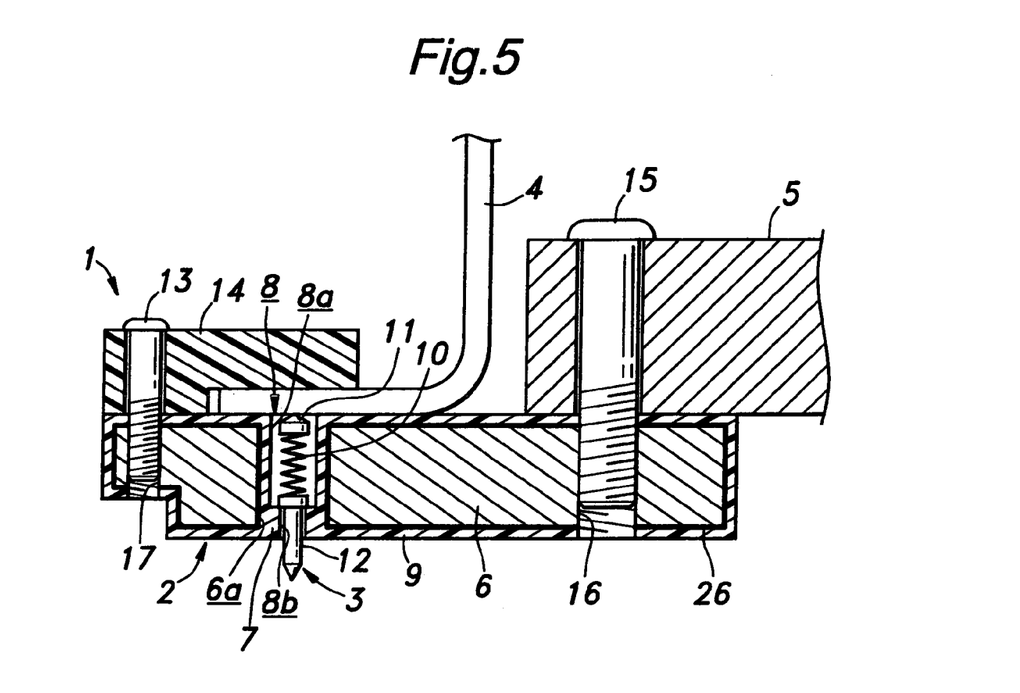
FIG. 5 is a view similar to FIG. 1 showing a fourth embodiment of the present invention.

The plastic layer 9 was directly formed over the surface of the high strength base plate 6 in the foregoing embodiment, but it may also be formed over the surface of the high strength base plate 6 via an insulating film 26 as illustrated in FIG. 5 which is similar to FIG. 1. In FIG. 5, the parts corresponding to those of the previous embodiments are denoted with like numerals without repeating the description of such parts.

Referring to FIG. 5, relatively thin film 26 (tens or hundreds of μm thick) made of such material as insulating plastic material is coated on the surface of the high strength base plate 6 having the openings 6a. The possible methods of coating may include calendar process, extrusion, immersion, spraying, spreading and electrostatic deposition. A holder hole forming member 7 made of plastic material or the like that is suitable for machining or otherwise forming the holder holes for the contact units is filled into the opening 6a. A layer made of the same material is placed over the part of the film 26 corresponding to the surface of the high strength base plate 6.

By so doing, the insulation that is required when the high strength base plate 6 is made of metallic material can be ensured, and the material for the holder hole forming member 7 can be selected from those having desirable properties but not particularly superior in electric insulation. For instance, the material for the holder hole forming member 7 may be provided with a favorable electrostatic property. The film 26 may consist of material demonstrating a strong bonding force with respect to the plastic material, and the provision of film 26 made of such material on the inner circumferential surface of the opening 6a ensures a strong attachment between the plastic holder hole forming member 7 filled in the opening 6a and high strength base plate 6.

The present invention is not limited in application to those for testing LCD panels before completion as described above in association with the drawings, but may also be used in other testing and other devices using contact units. For instance, the present invention can be applied to sockets that are used for testing devices, package base boards for mounting semiconductor chips and high density probes for wafer level tests. In such applications also, the holder is desired to have a high mechanical strength, and the positional precision of the contact points are desired to be maintained over a prolonged period of time. The present invention provides various benefits in such applications.

Figure 6A:
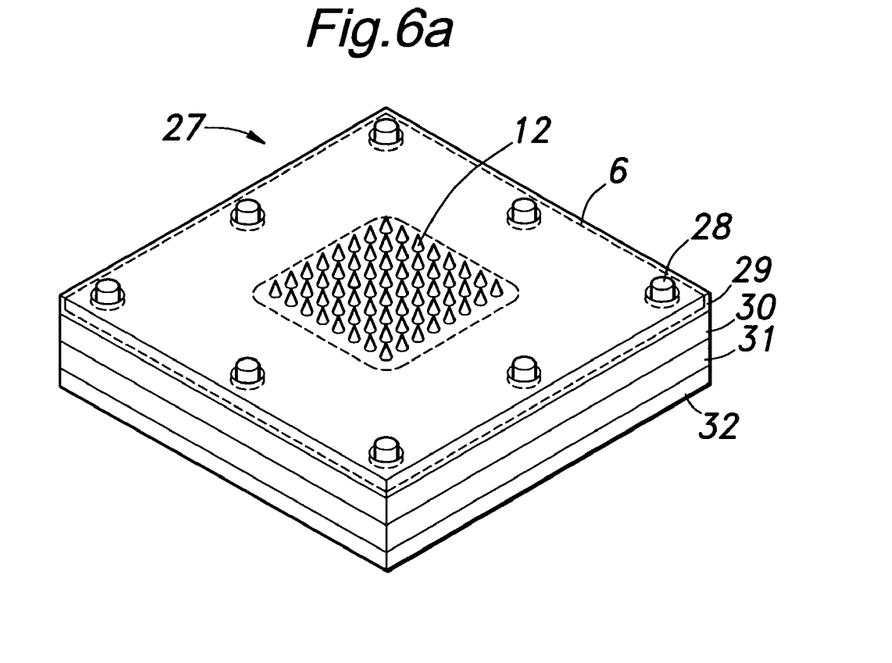
FIG. 6a is a perspective view showing a contact probe provided with highly concentrated contact units given as a fifth embodiment of the present invention.
Figure 6B:
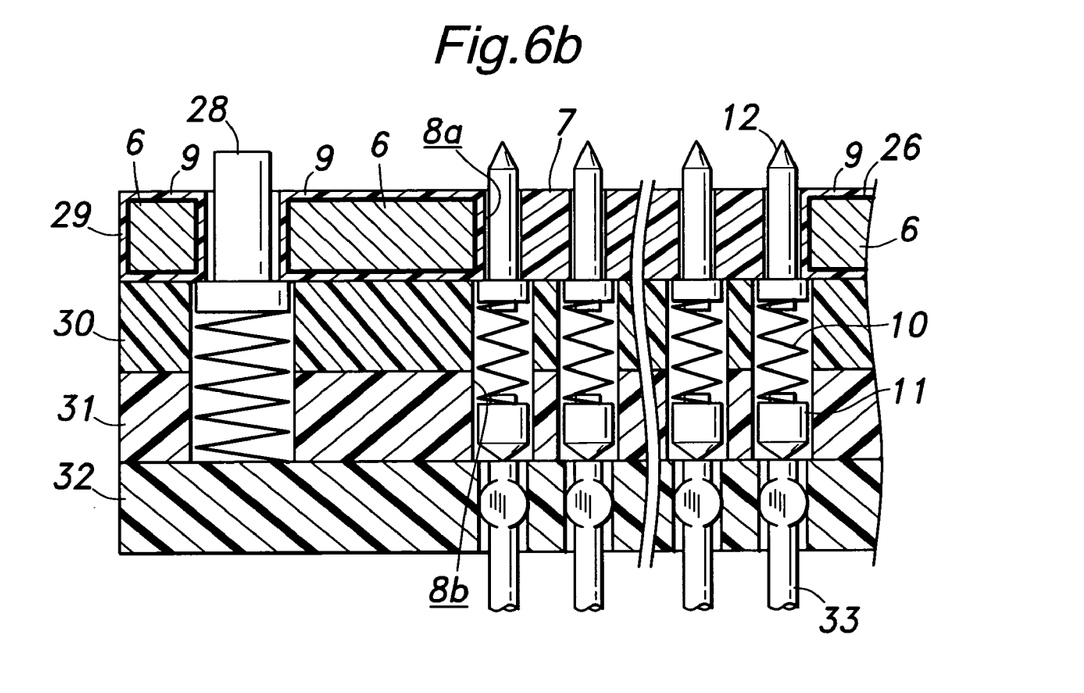
FIG. 6b is a fragmentary longitudinal sectional view of the contact probe provided with highly concentrated contact units

FIGS. 6a and 6b show such an example in the form of a highly dense probe 27. FIG. 6a is a overall perspective view of the contact probe, and FIG. 6b is a fragmentary longitudinal sectional view thereof. This probe 27 is designed for electrically testing a package base board for mounting a semiconductor chip. The parts corresponding to those of the previous embodiments are denoted with like numerals without repeating the description of such parts.

The needle members 12 for contacting the corresponding land portions on the side of the chips are concentrated in a central part of the contact probe 27, and a plurality of pushers 28 are arranged along the periphery of the contact probe 27. Each pusher 28 is urged upward by a compression spring, for instance, and controls the possible warping of the package base board (not shown in the drawing) that would be placed above during testing under the pressure from the contact probe 27 by resiliently urging the peripheral part of the package base board.

The contact probe 27 is provided with a holder consisting of four layers of support members 29, 30, 31 and 32 as shown in the drawing. The upper support member 29 is provided with a plastic layer 9 placed over the surface of a high strength base plate 6 via an insulating film 26 in a similar manner as the example shown FIG. 5. The embodiment provides similar advantages as those of the previous embodiments. The other support members 30, 31 and 32 may also consist of plastic base plates. The large diameter hole 8a for receiving the coil spring 10 and the other needle member 11 are formed in the two intermediate support members 30 and 31, and the lowermost base plate 32 is provided with external lead 33s which are press fitted into holes formed in the support member 32 so as to correspond to the large diameter holes 8a. The needle members 11 engage the end surfaces of the external leads 33.

Figure 7A:
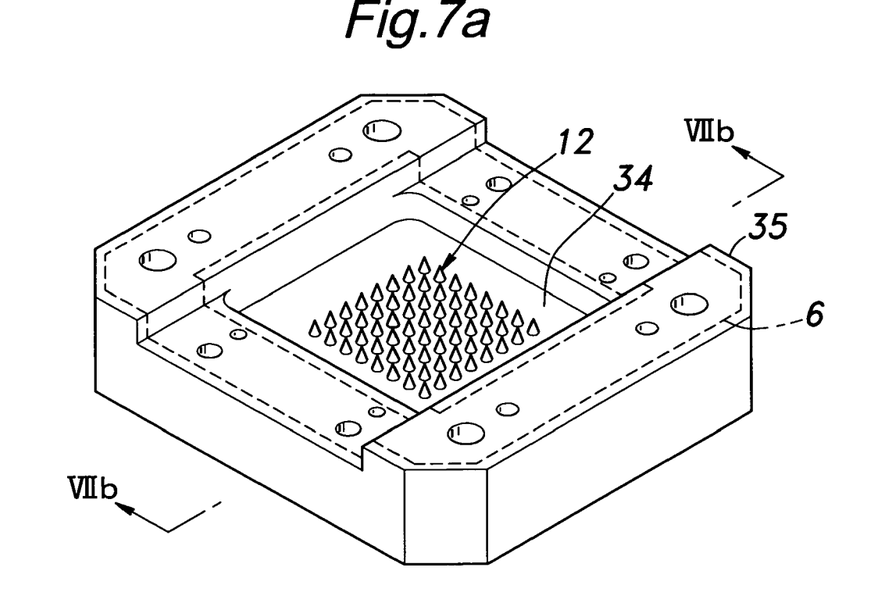
FIG. 7a is a perspective view showing a socket given as a sixth embodiment of the present invention.
Figure 7B:
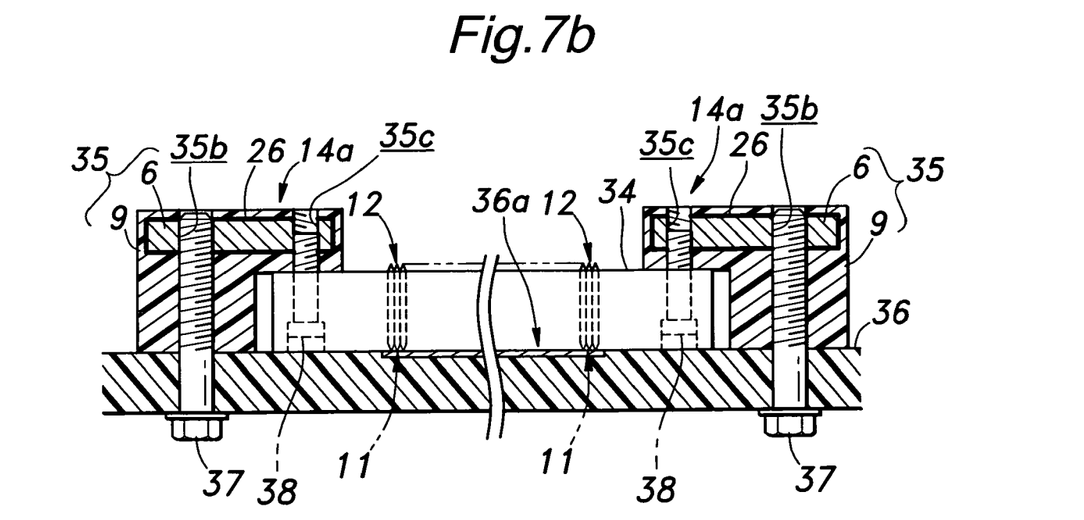

FIGS. 7a and 7b show another example in the form of a socket. FIG. 7a is an overall perspective view of the socket, and FIG. 7b is a fragmentary longitudinal sectional view thereof. This socket comprises a socket main body 34 and a base 35 in the form of a frame and serving as a retainer, and is used for mounting an IC chip on a printed circuit board, for instance. The socket main body 34 may be similar in structure to the contact probe shown in FIG. 6.

Referring to FIG. 7b, the socket main body 34 is fixedly attached to a circuit board consisting of a tester board 36 in this case via the base 35. A circuit pattern 36a is formed on the tester board 36 corresponding to the needle members 11 of the socket main body so that the needle members 11 may engage the corresponding terminal portions of the circuit pattern 36a.

The base 35 is provided with an inverted L-shaped cross section, and is adapted to surround and cover the peripheral part of the socket main body 34 as shown in the drawing. The base 35 is located with respect to the tester board 36 by locator pins not shown in the drawing, and is fixedly attached to the tester board 36 by threaded bolts now shown in the drawing. The peripheral part of the socket main body 34 is attached to the inwardly directed flange portion 35a of the base 35 that covers the peripheral part of the socket main body 34 by threaded bolts 38.

The base 35 is formed by placing a plastic layer 9 over the surface of a high strength base plate 6 via an insulating film 26 similarly as the previous embodiment, and the overall shape of the base 35 is defined by the plastic material of the plastic layer 9. This embodiment provides similar advantages as the previous embodiments.

In the illustrated embodiment, the threaded holes 35b for joining the base 35 with the tester board 36 by using threaded bolts and the threaded holes 35c for joining the base 35 with the socket main body 34 by using threaded bolts are all formed in the high strength base plate 6. This ensures a strong force for attachment, and allows the socket main body 34 to be attached to the tester board 36 at high precision and in a highly rigid manner. When such a strong force for attachment is not required, the threaded holes 35b and 35c may not be provided in the high strength base plate 6.

Figure 8A:
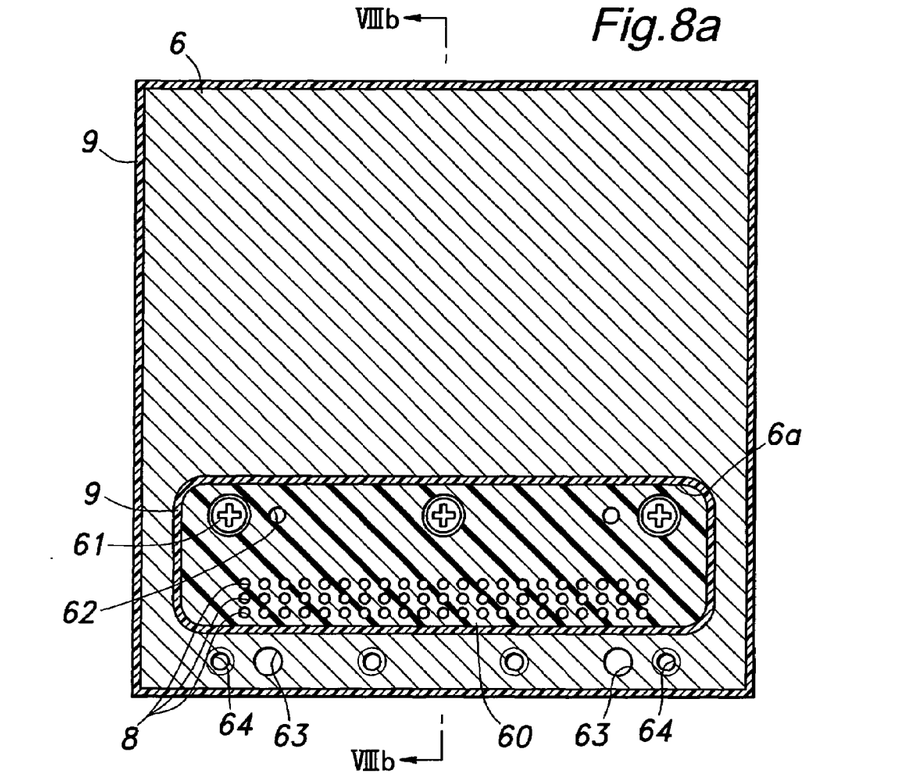
FIG. 8a is a fragmentary longitudinal sectional view of a contact probe holder given as a seventh embodiment of the present invention.
Figure 8B:
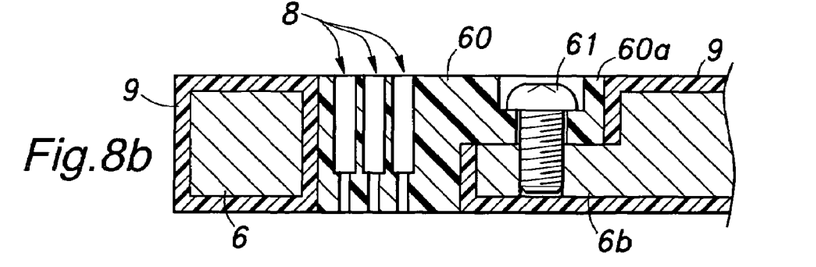
FIG. 8b is a view similar to FIG. 8a showing the holder having a plastic layer formed over a high strength base plate.

FIGS. 8a and 8b show a holder suitable for use in a contact probe for testing LCD panels similarly as the embodiment illustrated in FIGS. 1 and 3. The parts corresponding to those of the previous embodiment are denoted with like numerals without repeating the description of such parts.

A high strength base plate 6 made of a heat resistant metallic material having a low coefficient of thermal expansion such is invar and covar is provided with an opening 6a in the form of a slot, and a plastic layer 9 made of highly insulating plastic material is deposited on the surface of the base plate in the form of film. The opening 6a receives a holder hole forming member 60 therein. A thin-walled portion 6b of the base plate 6 extends along a side of the opening 6a, and a corresponding thin-walled portion 60a of the holder hole forming member 60 is placed over the thin-walled portion 6b of the base plate 6. Threaded bolts 16 are passed through through-holes formed in the thin-walled portion 60a of the holder hole forming member 60, and are threaded into corresponding threaded holes formed in the thin-walled portion 6b of the base plate 6 to firmly join these two parts together.

The holder hole forming member 60 and plastic layer 9 are made of different plastic materials, and the plastic layer 9 contributes to a firm bonding between the holder hole forming member 60 and the base plate 6 and demonstrates a high level of insulation. The base plate 6 is provided with threaded holes 64 and locating holes 63 for fixedly securing a fixed bracket or the like to the holder.

Figure 8C:
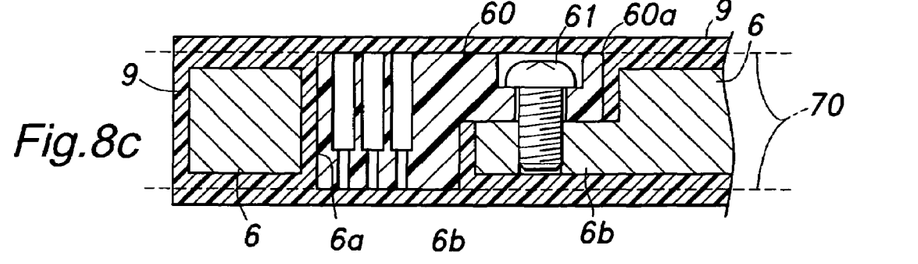
FIG. 8c is a view similar to FIG. 8a showing an intermediate stage of fabricating the holder.

FIG. 8c shows an intermediate stage of fabricating the holder shown in FIGS. 8a and 8b. First of all, the holder hole forming member 60 is fixed in position inside the opening 6a of the base plate 6 having the plastic layer 9 formed thereon by using the threaded bolts 16. For this purpose, locating holes are provided in the two thin-walled portions 60a and 6b, and only the locating holes 62 formed in the thin-walled portion 60a of the holder hole forming member 60 are shown in FIG. 8a. Thereafter, the same material as the plastic layer 9 is deposited over the entire surface of the holder not only to cover the surfaces of both the base plate 6 and holder hole forming member 60 but also to fill the gaps between them. The surface of the plastic layer 9 now given with an increased thickness is machined or ground until the holder hole forming member 60 is exposed (as indicated by the broken lines 70 in FIG. 8c.

Thus, according to the present invention, the base plate of the holder may be made of metallic material having a low coefficient of thermal expansion. In such a case, because the holder can be considered as being essentially made of metallic material, dimensional changes owing to changes in temperature during testing (tests under high temperature conditions) can be controlled easily as compared with the case where the holder is entirely made of plastic material. Dimensional changes due to aging compounded by residual stress can be avoided. Therefore, even when the terminals of the chip or the like that are to be accessed are densely arranged, an adequate level of positional precision can be maintained in the pitch of the corresponding contact units without regard to the surrounding environment and the service period, and tests can be conducted in a stable manner over an extended period of time.

By forming film on the inner circumferential surface of the opening to ensure a strong bonding force with respect to the holder hole forming member, a high bonding force is provided between the holder hole forming member and the opening, and the contact probe can be formed as a highly integral unit.

When the threaded holes for joining the holder to another member are provided in the high strength base plate, the mechanical strength of the thread is increased as compared with that formed in a plastic member, and the fastening force of the threaded bolts can be increased. Therefore, the holder can be firmly joined to the other member. Also, even if the holder is assembled and disassembled repeatedly, the thread would not be damaged, and the maintenance of the contact probe is facilitated.

The holder hole forming member may consist of plastic material which does not tend to generate static electricity, and the part of the surface of the high strength base plate that requires insulation may be provided with an insulating film. In this manner, even when the electrostatic property is required to be considered owing to the highly dense population of the terminals of the chip or other object to be tested, the holder hole forming member may be made from plastic material having a favorable electrostatic property as the insulating film makes up for the deficiency of the material of the holder hole forming member may have in electric insulation.

By virtue of the laminated structure including film and material suitable for forming holder holes, the masking that would be necessary when material suitable for forming holder holes is simply filled into the opening is not required, and the work efficiency can be improved. If film consisting of insulating plastic material is coated over the surface of the base plate, and the material suitable for forming holder holes that is placed over the film is electrically insulating, the overall insulating property can be improved owing to the provision of the two layers of insulating material. Therefore, the thickness of the film and layer can be reduced without impairing the insulating performance, and the reduced thickness of the film and layer allows the thickness of the holder to be minimized.

Although the present invention has been described in terms of preferred embodiments thereof, it is obvious to a person skilled in the art that various alterations and modifications are possible without departing from the scope of the present invention which is set forth in the appended claims.

The invention claimed is:

1. An electroconductive contact probe holder for supporting a plurality of contact units for contacting an object, comprising:
   a base plate made of a first material and provided with an opening therein;
   film made of a second material and deposited on a surface of said base plate so as to cover at least an inner circumferential surface of said opening;
   a holder hole forming member made of a third material and filled in said opening substantially without extending outside said opening; and
   a plurality of holder holes being passed across a thickness of said holder hole forming member each for receiving a contact unit therein, wherein said second and third materials comprise a same or different plastic materials.

2. An electroconductive contact probe holder according to claim 1, wherein said first material comprises a member selected from a group consisting of metallic material, semiconductor material, ceramic material and glass material.

3. An electroconductive contact probe holder according to claim 1, wherein said film is formed substantially over an entire surface of said base plate.

4. An electroconductive contact probe holder according to claim 1, wherein said film is made of material that promotes bonding between said holder hole forming member and said base plate.

5. An electroconductive contact probe holder according to claim 1, wherein said film is made of material that promotes electric insulation between said holder hole forming member and said base plate.

6. An electroconductive contact probe holder according to claim 1, wherein said second material is more electrically insulating than said third material, and said third material produces less static electricity than said second material.

7. An electroconductive contact probe holder according to claim 1, wherein an engagement feature is formed on an inner circumferential surface of said opening.

8. An electroconductive contact probe holder according to claim 7, wherein said base plate is made of a silicon wafer and the engagement feature comprises an inwardly directed ridge formed by anisotropically etching said inner circumferential surface of said opening.

9. An electroconductive contact probe holder according to claim 1, wherein said base plate is provided with a threaded hole for joining said holder with another member.

10. An electroconductive contact probe holder according to claim 1, wherein said base plate is provided with a locating hole for locating said holder with respect to another member.

11. An electroconductive contact probe holder according to claim 1, wherein said holder hole forming member is provided with a locating hole for locating said holder with respect to another member.

12. An electroconductive contact probe holder according to claim 1, wherein said film is formed substantially only on an inner circumferential surface of said opening.

13. An electroconductive contact probe holder according to claim 1, wherein said holder hole forming member is fixedly secured in said opening with a threaded bolt.

14. An electroconductive contact probe holder according to claim 13, wherein said film is deposited on said base plate with said holder hold forming member placed in said opening.

15. An electroconductive contact probe holder according to claim 14, wherein a surface of said film is finished by machining.

16. An electroconductive contact probe holder according to claim 14, wherein a surface of said film is finished by grinding.

* * * * *